United States Patent
Acconcia et al.

(10) Patent No.: US 10,386,388 B2
(45) Date of Patent: Aug. 20, 2019

(54) CONTACT PROBE AND CORRESPONDING TESTING HEAD

(71) Applicant: TECHNOPROBE S.p.A., Cernusco Lombardone (IT)

(72) Inventors: Daniele Acconcia, Cernusco Lombardone (IT); Raffaele Vallauri, Cernusco Lombardone (IT)

(73) Assignee: TECHNOPROBE S.P.A., Cernusco Lomdardone (IT)

( * ) Notice: Subject to any disclaimer, the term of this patent is extended or adjusted under 35 U.S.C. 154(b) by 132 days.

(21) Appl. No.: 15/718,430

(22) Filed: Sep. 28, 2017

(65) Prior Publication Data

US 2018/0024166 A1 Jan. 25, 2018

Related U.S. Application Data

(63) Continuation-in-part of application No. PCT/EP2016/055152, filed on Mar. 10, 2016.

(30) Foreign Application Priority Data

Mar. 31, 2015 (IT) .......................... 102015000010483

(51) Int. Cl.
*G01R 1/073* (2006.01)
*G01R 1/067* (2006.01)

(52) U.S. Cl.
CPC ..... *G01R 1/07378* (2013.01); *G01R 1/06733* (2013.01); *G01R 1/06744* (2013.01);
(Continued)

(58) Field of Classification Search
CPC ........... G01R 1/06705; G01R 1/06755; G01R 1/071; G01R 31/308; G01R 31/311; G01R 1/07307; G01R 1/07342
See application file for complete search history.

(56) References Cited

U.S. PATENT DOCUMENTS 4,622,514 A † 11/1986 Lewis
7,417,447 B2 * 8/2008 Kister ................ G01R 1/07371
324/750.16
(Continued)

FOREIGN PATENT DOCUMENTS

JP 2007-232558 A 9/2007
JP 2008-197009 A 8/2008
(Continued)

*Primary Examiner* — Tung X Nguyen
(74) *Attorney, Agent, or Firm* — Seed IP Law Group LLP

(57) ABSTRACT

It is described a contact probe for a testing head for a testing apparatus of electronic devices, the probe comprising a probe body extended in a longitudinal direction between respective end portions adapted to contact respective contact pads, the second end being a contact tip adapted to abut onto a contact pad of the device under test, the body of each contact probe having a length of less than 5000 μm, and including at least one pass-through opening extending along its longitudinal dimension. Conveniently, the at least one pass-through opening is filled by a filling material, in order to define at least one first and one second lateral portions in the body, being parallel and joined to each other by a connecting central portion realized by the filling material at the pass-through opening, the connecting central portion made of the filling material acting as a strengthening element.

30 Claims, 14 Drawing Sheets

(52) U.S. Cl.
CPC ..... *G01R 1/06755* (2013.01); *G01R 1/07357* (2013.01); *G01R 1/06716* (2013.01); *G01R 1/06772* (2013.01); *G01R 1/07314* (2013.01)

(56) References Cited

U.S. PATENT DOCUMENTS

| | | | |
|---|---|---|---|
| 2004/0005792 A1 | 1/2004 | Sabatier et al. | |
| 2004/0135594 A1* | 7/2004 | Beaman | G01R 1/07357 324/754.18 |
| 2009/0002009 A1* | 1/2009 | Brandorff | G01R 1/07357 324/750.16 |
| 2010/0231249 A1 | 9/2010 | Dang et al. | |
| 2012/0242363 A1† | 9/2012 | Breinlinger | |
| 2014/0043054 A1 | 2/2014 | Kister | |
| 2015/0015289 A1† | 1/2015 | Eldridge | |
| 2015/0280345 A1 | 10/2015 | Kimura et al. | |

FOREIGN PATENT DOCUMENTS

| | | | |
|---|---|---|---|
| JP | 2012-173263 A | † | 9/2012 |
| JP | 2013-257299 A | † | 12/2013 |
| JP | 2014-71069 A | | 4/2014 |
| JP | 2010-107291 A | † | 5/2015 |

\* cited by examiner
† cited by third party

CONTACT PROBE AND CORRESPONDING TESTING HEAD

BACKGROUND

Technical Field

The present disclosure refers to a contact probe, particularly for high frequency applications.

More specifically, the disclosure refers to a contact probe having a body extending between a first and a second end, the second end being a contact tip abutting onto a contact pad of the device under test, that body having a length less than 5000 μm.

The disclosure also refers to a testing head including a plurality of those contact probes, particularly for high frequency applications.

The disclosure, particularly but not exclusively, relates a vertical contact probe and a corresponding testing head to test electronic devices being integrated on a wafer and the following description is made referring to this application field with the only purpose of simplifying the exposition.

Description of the Related Art

As it is well known, a testing head (or probe head) is a device suitable to electrically connect a plurality of contact pads of a microstructure to corresponding channels of a testing machine performing the functional test thereof, particularly the electrical one, or generically the test.

The test done on integrated circuits is particularly useful to detect and isolate defective circuits while in the production phase. Normally, the testing heads are used for electrically testing the integrated circuits on wafer before cutting and assembling them inside a chip-containing package.

A testing head basically includes a plurality of mobile contact elements or contact probes being held by at least a pair of substantially plate-shaped supports or guides being parallel to each other. Those plate-shaped supports are provided with suitable holes and are arranged at a certain distance from each other in order to leave a free space or air gap for the movement and possible deformation of the contact probes. The pair of plate-shaped supports particularly includes an upper plate-shaped support and a lower plate-shaped support, both provided with respective guiding holes where the contact probes axially slide, the probes being usually made of special alloy wires having good electrical and mechanical properties.

The good connection between testing probes and contact pads in the device under test is ensured by pressing the testing head onto the device itself, the contact probes, being movable inside the guiding holes made in the upper and lower plate-shaped supports during that pressing contact, undergoing a bending inside the gap between the two plate-shaped supports and a sliding inside those guiding holes. Testing heads of this kind are usually called "vertical probe" heads.

Essentially, the testing heads with vertical probes have a gap where a bending of the contact probes happens, that bending being able to be helped by a proper configuration of the probes themselves or of their supports, as schematically shown in FIG. 1, where, for the sake of illustration simplicity, only one contact probe of the plurality of probes normally included in a testing head has been shown.

Particularly, in FIG. 1 a testing head 1 is schematically shown including at least one lower plate-shaped support 2, usually called "lower die", and an upper plate-shaped support 3, usually called "upper die", having respective guide holes 4 and 5 inside which at least one contact probe 6 slides.

The contact probe 6 ends at an end with a contact tip 7 intended to abut onto a contact pad 8 of a device under test 10, in order to realize the electrical and mechanical contact between said device under test 10 and a testing apparatus (not shown) of which that testing head 1 forms a terminal element.

With the term "contact tip" herein and below it is meant an end zone or region of a contact probe intended to contact the device under test or the testing apparatus, such a end zone or region not necessarily being sharp.

In some cases, the contact probes are fixedly fastened to the head itself at the upper plate-shaped support: the testing heads are referred to as blocked probes testing heads.

More often however, testing heads are used having non-fixedly fastened probes, but being kept interfaced to a so-called board, possibly by means of a micro contact holder: the testing heads are referred to as non-blocked probes testing heads. The micro contact holder usually is called "space transformer" because, besides contacting the probes, it also allows spatially redistributing the contact pads made on it with respect to the contact pads of the device under test, particularly relaxing the distance constraints between the center of the pads themselves.

In this case, as shown in FIG. 1, the contact probe 6 has another contact tip, indicated as contact head 15, towards a pad 11 of a plurality of contact pads of the space transformer 12. The good electrical contact between probes 6 and space transformer 12 is ensured similarly to the contact with the device under test 10 by pressing the contact heads 15 of the contact probes 6 onto the contact pads 11 of the space transformer 12.

The upper and lower plate-shaped supports 2 and 3 are suitably separated by a gap 9 allowing the deformation of the contact probes 6. Finally, the guide holes 4 and 5 are sized in order to allow the contact probe 6 to slide thereinto.

In case of a testing head made in the technology called "with shifted plates", the contact probes 6, also called "buckling beams", are made straight, the shifting of the supports causing a bending of the body of the probes, and the desired holding of the probes themselves due to the friction with the walls of the guide holes where they slide. In that case, they are referred to as testing heads with shifted plates.

The shape of the bending to which the probes are undergoing and the force needed to cause that bending depend on several factors, such as the physical characteristics of the alloy composing the probes and the value of the offset between the guide holes in the upper plate-shaped support and the corresponding guide holes in the lower plate-shaped support.

The proper working of a testing head is essentially bound to two parameters: the vertical movement, or overtravel, of the contact probes and the horizontal movement, or scrub, of the contact tips of those probes. It is known that it is important to ensure the scrub of the contact tips in order to allow scratching the surface of the contact pads removing the impurities, for example in the form of a thin oxide layer or film, thus enhancing the contact being carried out by the testing head.

All these characteristics are to be evaluated and calibrated in the manufacturing phase of a testing head, having to be always guaranteed the good electrical connection between probes and device under test, particularly between contact tips of the probes and contact pads of the device under test.

It is equally important to guarantee that the pushing contact of the contact tips of the probes onto the contact pad of the device is not so high to cause the breaking of the probe or of the pad itself.

This issue is particularly felt with the so-called short probes, namely probes with a rod-like body having a limited length and particularly with dimensions less than 5000 µm. This kind of probes are used for example in high frequency applications, where the reduced length of the probes limits the corresponding self-inductance phenomenon. Particularly, with the term "high frequency applications" it is meant probes being able to carry signals having frequencies higher than 1000 MHz.

In that case, however, the reduced length of the body of the probes steeply increases the stiffness of the probe itself, which implies an increase of the force being exerted by the respective contact tip on the contact pads, for example of a device under test, which can lead to break those pads, irreparably damaging the device under test, a circumstance that should be obviously avoided. In a more dangerous way, the increase of the stiffness of the contact probe, due to the reduction of its body length, increases the risk of breaking the probes themselves.

A multipath probe is disclosed for instance in the US Patent Publication No. US 2015/0015289 to Eldridge. The probe has a multilayered structure defining different electrically conductive paths, electrically insulated one another by an electrically insulating gap, also in the form of a layer. Moreover, the PCT application published under No. WO 2014/087906 on Jun. 12, 2014 in the name of Japan Electronic Material Corp discloses an electrical contact probe, having a layered structure and comprising an elastic deformation part formed to include three beam parts of which adjacent ones are arranged through a gap, such a configuration making it possible to shorten the length of the probe to improve the high frequency characteristics of the contact probe while ensuring an overdrive amount and probe pressure.

BRIEF SUMMARY

An embodiment of the present disclosure is directed to a testing head having such functional and structural characteristics to allow using it in high frequency applications with probes having a length less than 5000 µm, yet guaranteeing enough elasticity of the contact probes and thus lowering the risk of breaking them, and the force that the corresponding end portions exert when abutting onto the corresponding contact pads, overcoming the limitations and the drawbacks still conditioning the testing heads being realized according to the known art.

The testing head comprises probes having at least one opening being realized in the corresponding rod-shaped bodies according to a longitudinal direction of the body itself, filled with a suitable filling material, particularly a polymeric one, being able to reduce the stiffness of the probes and consequently the pressure exerted by the probes on the contact pads, at the same time guaranteeing enough elasticity to the body of those probes and preventing the development of cracks or breakings of the probe body due to its warping during the normal operation of the testing head including it.

According to an aspect of the disclosure, a vertical contact probe of a testing head for a testing apparatus of electronic devices may comprise a probe body essentially extended in a longitudinal direction between respective end portions adapted to contact respective contact pads, the second end being a contact tip adapted to abut onto a contact pad of a device under test, characterized in that the body of each vertical contact probe has a length of less than 5000 µm, and includes at least one pass-through opening, extending along its longitudinal dimension and characterized in that the at least one pass-through opening is filled by a filling material, in order to define at least one first and one second lateral portions in that body, being parallel and joined to each other by a connecting central portion formed by the filling material at the opening, the connecting central portion made of the filling material acting as a strengthening element.

According to another aspect of the disclosure, the vertical contact probe can include a plurality of pass-through openings realized in the body, being parallel to each other, having equal or different length and/or width and defining a plurality of lateral portions in the body, at least one of those pass-through openings preferably all the pass-through openings, being filled by the filling material to form at least one connecting central portion acting as a strengthening element.

According to another aspect of the disclosure, the vertical contact probe can further include at least one material bridge arranged inside the at least one pass-through opening, adapted to connect the lateral portions to each other on the sides of the pass-through opening.

Particularly, the vertical contact probe can include a plurality of material bridges arranged inside one or more of the pass-through opening or openings.

Moreover, that material bridge or at least one of those material bridges can be placed at one end of a corresponding pass-through opening.

According to another aspect of the disclosure, the vertical contact probe can further include at least one protruding element or stopper originating from one of its lateral walls.

The stopper can have a lateral extension having a dimension comparable to a diameter of the vertical contact probe, preferably being between 5 and 40 µm.

According to another aspect of the disclosure, the filling material can be a polymeric material, preferably Parylene®, or an inorganic dielectric material, preferably alumina ($Al_2O_3$).

Moreover, the filling material can coat the whole vertical contact probe.

The technical problem can also be solved by a testing head with vertical contact probes for the functionality testing of a device under test, including a plurality of vertical contact probes being realized as stated above.

According to another aspect of the disclosure, the testing head can include further vertical contact probes without pass-through openings, the vertical contact probes provided with pass-through openings filled with the filling material being apt to abut onto contact pads belonging to a power region of the device under test and the further vertical contact probes without pass-through openings being apt to abut onto further contact pads belonging to a signal region of the device under test, the contact pads having greater dimensions and pitch than the further contact pads.

More particularly, the further vertical contact probes without pass-through openings can have a probe diameter smaller than a probe diameter of the vertical contact probes provided with pass-through openings filled with the filling material.

According to another aspect of the disclosure, the testing head can further include at least one auxiliary guide, being arranged along the body of the vertical contact probes in parallel to a plane defined by the device under test and provided with suitable guide holes wherein one vertical contact probe slides through each of them, the auxiliary guide being adapted to define a gap including one end of the at least one pass-through opening being a critical portion of the body of the vertical contact probes, namely a zone more prone to breakings in the body, the critical portion being positioned in the gap so that it undergoes low or even no bending stresses with respect to the rest of the body of the vertical contact probes.

According to another aspect of the disclosure, the testing head can further comprise a support and include vertical contact probes with respective contact heads fixedly coupled to the support at a contact area, the auxiliary guide together with the support can define the gap, a further gap being defined in that case between the auxiliary guide and the plane defined by the device under test.

According to another aspect of the disclosure, the testing head can further include at least one lower guide and one upper guide, being flat and parallel to each other and provided with respective guide holes, inside which a respective vertical contact probe is housed, having a contact head adapted to abut onto a contact pad of a space transformer, the auxiliary guide, together with the upper guide or the lower guide respectively, can define the gap including one end of the at least one pass-through opening.

According to another aspect of the disclosure, the testing head can also include a further auxiliary guide arranged along the body of the vertical contact probes, in parallel to the planes of the lower, upper and auxiliary guides, provided with suitable guide holes where one vertical contact probe slides through each of them and arranged between the auxiliary guide and the lower guide or the upper guide respectively, wherein the further auxiliary guide together with the lower guide or the upper guide respectively, defines an additional gap including a further end of the at least one pass-through opening being a further critical portion of the body of the vertical contact probe, a further gap being defined in that case between the auxiliary guide and the further auxiliary guide and not comprising the critical portions of the body.

Particularly, the further gap can have a length between 1000 µm and 4000 µm, preferably between 2000 µm and 3000 µm and the gap and the additional gap, if any, can have lengths between 100 µm and 500 µm, preferably between 200 µm and 300 µm.

Finally, according to another aspect of the disclosure, each vertical contact probe can include at least one protruding element or stopper originating from one of its lateral walls, which can contact one wall of a guide hole of a guide above the protruding element or stopper.

The characteristics and advantages of the vertical contact probe and the testing head according to the disclosure will be evident from the description, made in the following, of one embodiment example thereof given by way of non-limiting example referring to the attached drawings.

DETAILED DESCRIPTION

Figure 1:
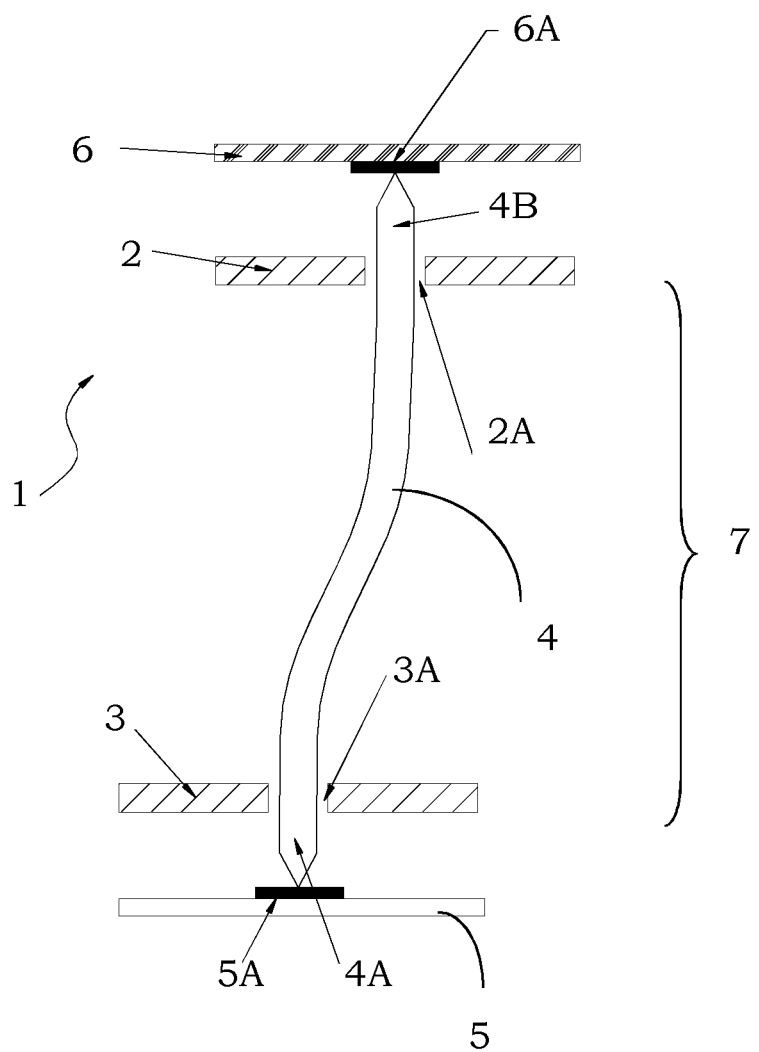
FIG. 1 schematically shows a testing head being realized according to the prior art.
Figure 2:
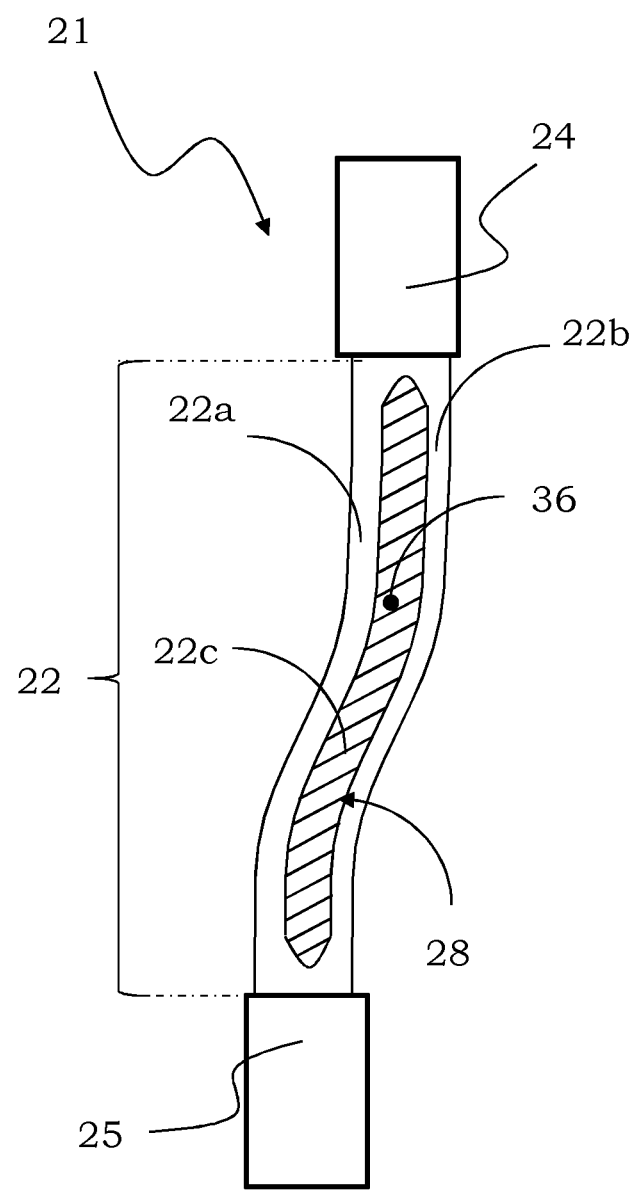
FIG. 2 schematically shows a contact probe being realized according to the present disclosure.

Referring to those figures, and particularly to FIG. 2, a contact probe being realized according to the disclosure is described and globally indicated as 21.

It should be noted that the figures represent schematic views and they are not drawn at scale, but instead are drawn in order to emphasize the important characteristics of the disclosure. Moreover, in the figures, the different parts are shown in a schematic way, their shape being able to change according to the desired application.

The contact probe 21 includes a rod-shaped body 22 having a preset length, intended as the longitudinal dimension of that body 22 in a non-warped configuration, and it is provided with respective end portions being contiguous to that body 22.

Conveniently, the contact probe is of the so-called short type and includes a body 22 with a length less than 5000 µm, making it suitable for high frequency applications, namely to carry signals having a frequency higher than 1000 MHz.

Each contact probe 21 also includes at least one first and one second end portion, particularly a contact head 24 and a contact tip 25, being contiguous to the body 22.

Conveniently, each contact probe 21 also includes an opening 28, extending along the body 22 in its longitudinal dimension. In the example shown in FIG. 2, that opening 28 substantially extends for all the length of the body 22, in a substantially central position. In other words, the opening 28 realizes a pass-through recess in the body, like a cut totally or at least mainly running along the body 22 length.

Therefore the body 22 of the contact probe 21 is formed by at least one first and one second lateral portion, 22a and 22b, substantially parallel and joined to each other by a central portion 22c at the opening 28.

In that way, the stiffness of the contact probe 21 is significantly reduced, reducing if not nulling the risks of breaking the body 22, also when the same has reduced dimensions suitable for the high frequency applications. Moreover, it is verified that the contact probe 21 exerts less force on a contact pad of a device under test with respect to a known contact probe having the same dimensions, without the opening 28.

However, tests made by the applicants underlined that, due to compressions and moreover to bendings to which the contact probe 21, particularly its body 22, undergoes during the testing head 20 life which includes it, during the thousands touch operations for the contact between the contact tip 25 and the contact pad of a device under test, exists at least one critical portion 28A of the body 22 that is prone to breakings, particularly near the junction of the lateral portions 22a and 22b, which drastically reduces the useful life of the testing head 20. More particularly, it is verified that at least one critical portion 28A is at one end of the opening 28 near the contact head 24.

Particularly, the critical portion 28A corresponds to a portion where a clear change in the cross-section occurs therefore determining a remarkable concentration of mechanical stresses.

Figure 3A:
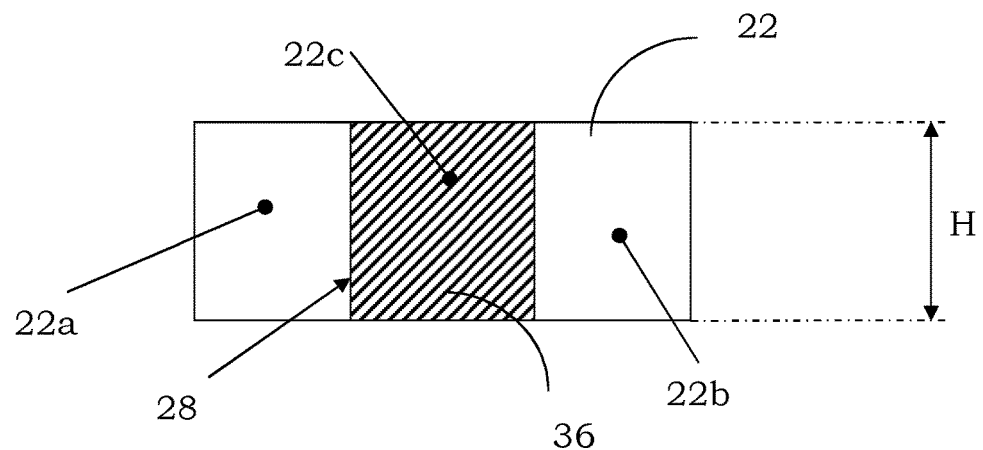
FIGS. 3A-3B schematically show cross-sections of alternative embodiments of the contact probe of FIG. 2.

Conveniently, according to the present disclosure, as schematically shown in the cross-section view of FIG. 3A, the contact probe 21 also includes at least one filling material 36, particularly a polymeric material, being able to realize a strengthening structure of the body 22 at the central portion 22c, being able to reduce, if not eliminate, the development of cracks or breakings at the lateral structures, 22a and 22b, significantly increasing the useful life of the contact probe 21 and therefore of a testing head including it.

Figure 3B:
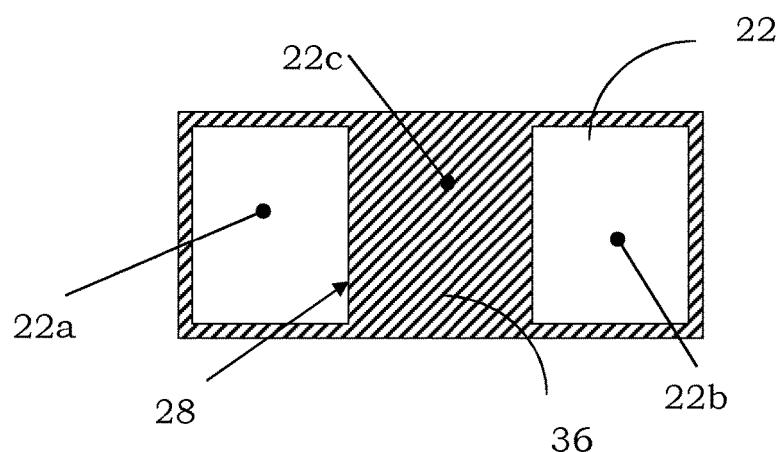

Alternatively, the filling material 36 can be realized in order to fill the opening 28 and also to coat the whole contact probe 21, as schematically shown in FIG. 3B.

It is also possible, according to one embodiment variation of the contact probe 21 according to the present disclosure, to provide the body 22 of the contact probes 21 included therein with a plurality of openings suitable to define a plurality of portions along that body 22, being substantially parallel to each other and separated from the openings.

Figure 4A:
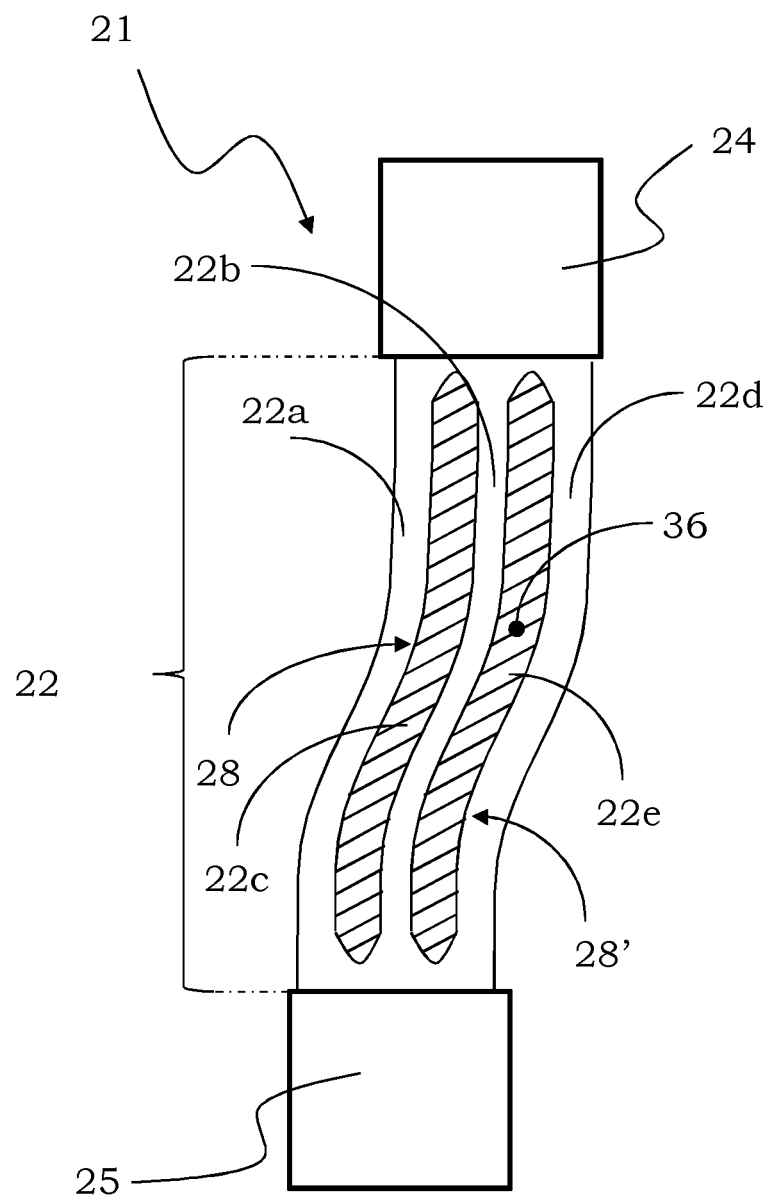
FIGS. 4A-4C schematically show different embodiments of the contact probe according to the disclosure.

By way of example, in FIG. 4A there is shown a contact probe 21 having at least one first opening 28 and one second opening 28' running along its body 22 for almost all its length and defining a plurality of material portions, 22a-22e, therein on the sides and at the openings 28 and 28'. As above, the openings 28 and 28' can extend along all the body 22 between respective ends thereof namely between the contact head 24 and the contact tip 25 of the contact probe 21. Clearly, it is possible to consider a plurality of openings not having the same length and/or width. At least one opening, preferably all the openings being realized in the body 22 are also filled with the filling material 36.

Figure 4B:
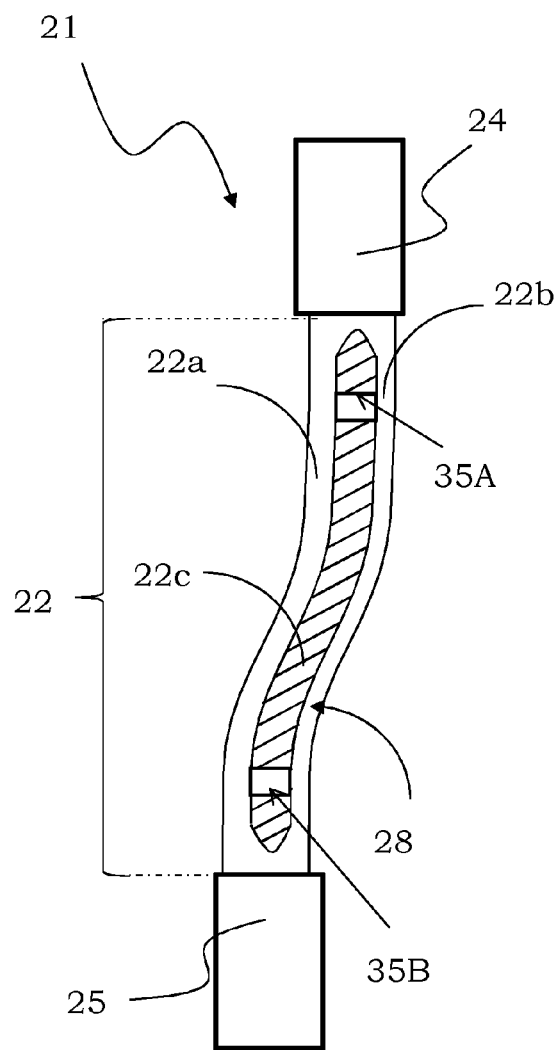

According to a further alternative embodiment, schematically shown in FIG. 4B, the contact probe 21 can also include material bridges 35 arranged inside the opening(s) 28 and suitable to connect to each other the material portions that are at the sides of those openings, substantially acting like strengthening elements. Advantageously according to the present disclosure, those material bridges 35 are conveniently placed near the end portions of the openings 28, which are the portions more prone to accumulate the stress and thus critical as for the starting of cracks or cuts that can affect the material portions on the sides or at each opening 28.

More particularly, in the example shown in FIG. 4B, there are shown two material bridges, 35A and 35B, placed in the opening 28 between the first and the second lateral portion, 22a and 22b, at the central portion 22c and being placed at the ends of the opening 28 itself, namely near the contact head 24 and the contact tip 25 of the contact probe 21.

Clearly, the number and position of the material bridges 35 can be different from what shown; for example it is possible to consider that those material bridges 35 can be in a number greater and/or smaller than two, realized at any position with respect to the ends of the opening, as well as inside all and/or only some of the openings 28.

Figure 4C:
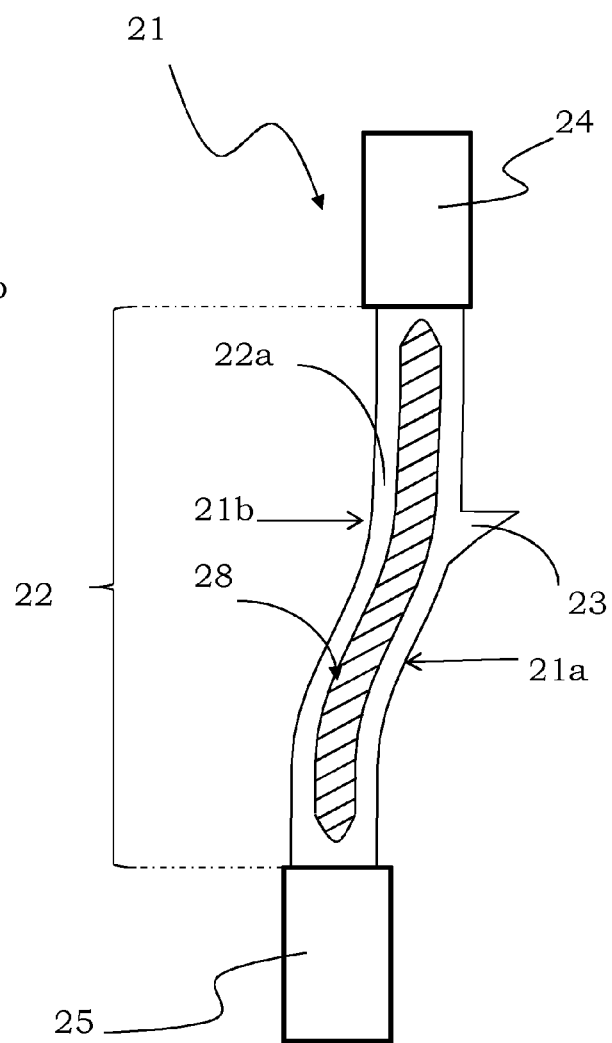

According to a further embodiment variation, schematically shown in FIG. 4C, the contact probe 21 can also include at least one element protruding from the respective body 22, at one of its lateral walls 21a. Particularly, that protruding element is used to realize stopping means of the contact probe 21 suitable to prevent the same from coming out from a testing head including it, also in the absence of a device under test or a space transformer onto which the end portions of the probes abut, particularly to prevent an upwards movement (in the local reference of the Figure) of that contact probe 21. Therefore, the protruding element is shown as stopper 23.

In a preferred embodiment being shown in the figure, the stopper 23 is tooth-shaped, being integral with the body 22 of the contact probe 21; moreover the stopper 23 can protrude from the body 22 with a lateral protrusion whose dimension is comparable to the diameter of the contact probe 21 and particularly a dimension between 5 and 40 µm, where with comparable it is meant that the difference between that overall lateral dimension and the diameter of the contact probe 21 is less than 20%. Moreover, it should be underlined that with the term diameter, here and in the following, it is meant a maximum transversal dimension of a cross-section being perpendicular to a longitudinal development axis of the contact probe 21, also in case of non-circular cross-sections.

Particularly, the stopper 23 only acts on the occasion of a possible upwards movement of the contact probe 21, for example in case of the removal of the space transformer and the undesired even if temporary "sticking" between the contact heads 24 of the probes and the contact pads of the space transformer. The stopper 23 is also able to prevent undesired movements of the contact probes 21 on the occasion of cleaning operations, which, as it is well known, are usually carried out by means of powerful air jets, particularly being able to move the contact probes.

In case the contact probe 21 also includes material bridges 35, as schematically shown in FIG. 4B, at the opening(s) 28, the polymeric material 36 coats or not also those material bridges 35. Particularly, in one embodiment, those material bridges 35 have a thickness equal to the one of the contact probe 21 and they can emerge or not from the filling material 36 that fills the openings 28.

Figure 5A:
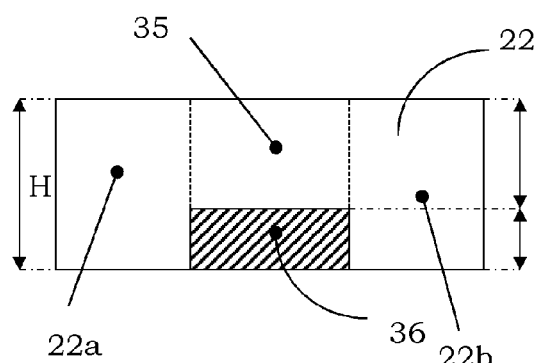
FIGS. 5A-5C and 6A-6C schematically show cross-sections of alternative embodiments of the contact probe of FIG. 4B.
Figure 5B:
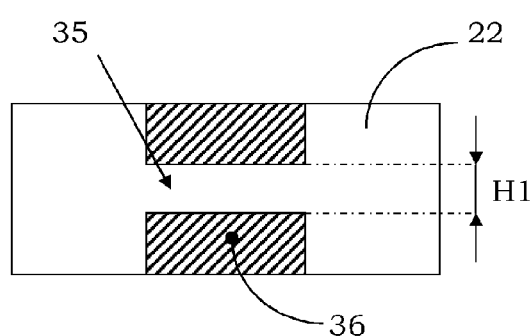
Figure 5C:
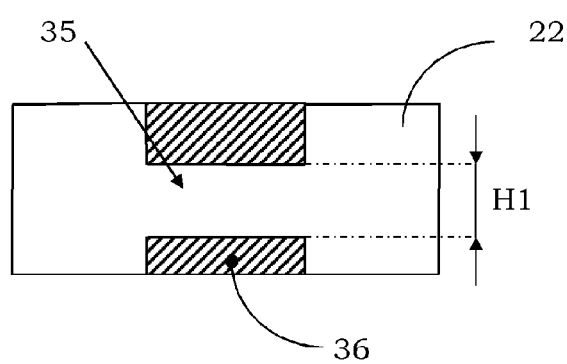

As an alternative, it is possible to consider material bridges 35 having a thickness H1 less than the thickness H of the contact probe 21, as schematically shown in the FIGS. 5A-5C, which show cross-section views of a contact probe 21 being taken at one of those material bridges 35 joining the lateral portions 22a and 22b of the body 22 of the contact probe 21.

More particularly, each material bridge 35 can have a thickness H1 equal to for example 10-90% of the thickness H of the contact probe 21.

Furthermore, it is possible to realize those material bridges 35 in order to have at least one side emerging and parallel to one side of the contact probe 21, as schematically shown in FIG. 5A. In that case, the filling material 36 can fill a cavity being defined at those material bridges and having a thickness H2 equal to the difference between the thickness H of the contact probe 21 and the thickness H1 of a material bridge, H2=H−H1.

According to an embodiment variation, the contact probe 21 can include material bridges 35 having a thickness H1 being arranged inside the envelope of the body 22 of the contact probe 21, according to a symmetrical configuration, as shown in FIG. 5B or an asymmetrical one as shown in FIG. 5C.

Also in that case, the filling material 36 can fill cavities being defined at those material bridges, having the same or different thickness.

Figure 6A:
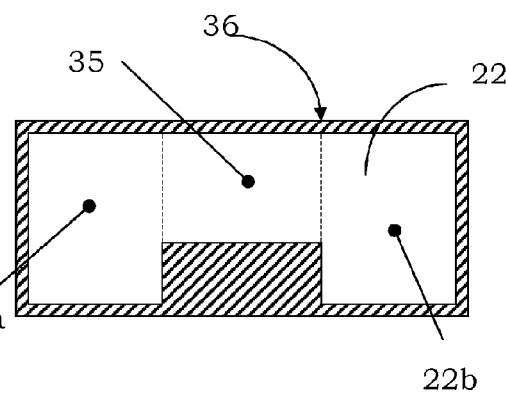
Figure 6B:
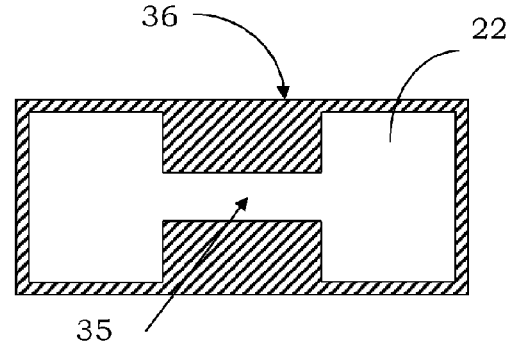
Figure 6C:
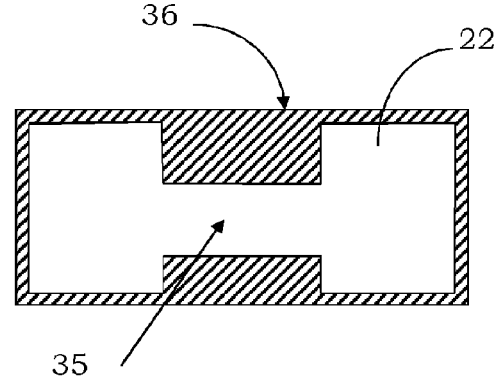

Conveniently, according to another alternative embodiment, the filling material 36 can be realized in order to fill and also to coat the whole contact probe 21, as schematically shown in the FIGS. 6A-6C.

Particularly, that filling material 36 is a polymeric material, preferably Parylene®, or an inorganic dielectric material, preferably alumina (Al$_2$O$_3$).

In particular, the process for manufacturing contact probes 21 wholly coated by the filling material 36 which fills the cavity 28 or the cavities 28A and 28B turns out to be simplified, since no particular limitations are needed for ensuring that the filling material 36 is provided only inside the cavity or cavities nor a further etching step is required in order to remove the filling material 36 outside the cavity or cavities.

Moreover, the filling material 36, being also a coating layer for the contact probe 21, can be chosen in order to enhance the performances of the probe as a whole. For instance, an insulating material can be chosen, limited to a body portion of the contact probe 21, so as to guarantee that no accidental contacts occur between adjacent probes. Alternatively, a conductive material having a high stiffness, such as rhodium, could be used to reduce the consumption of the probe itself, in particular in correspondence of end portions thereof.

Figure 7A:
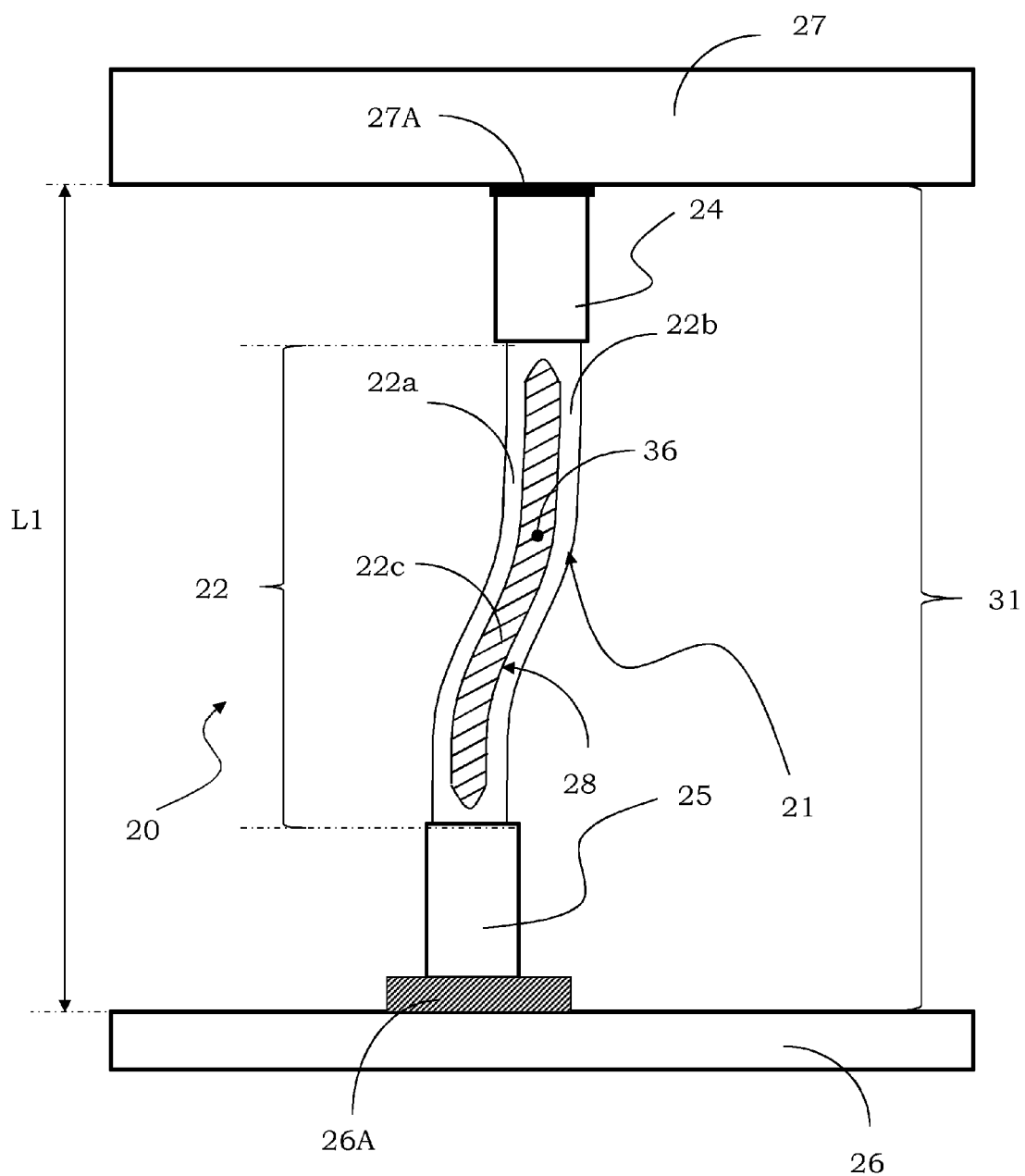
FIGS. 7A-7B schematically show an embodiment of the testing head according to the disclosure.

The present disclosure also refers to a testing head 20 including a plurality of contact probe 21 being realized as described above, as schematically shown in FIG. 7A, where only one probe is shown for sake of simplicity and clarity of illustration.

In that embodiment, the probe type is the free body one and it has the contact head 24 fixedly coupled, for example soldered, to a support 27, for example a ceramic one, particularly at a contact area 27A, while the contact tip 25 is suitable to abut onto contact pads 26A of a device under test 26. It is called as testing head 20 with fastened probes or with free body probes.

Figure 7B:
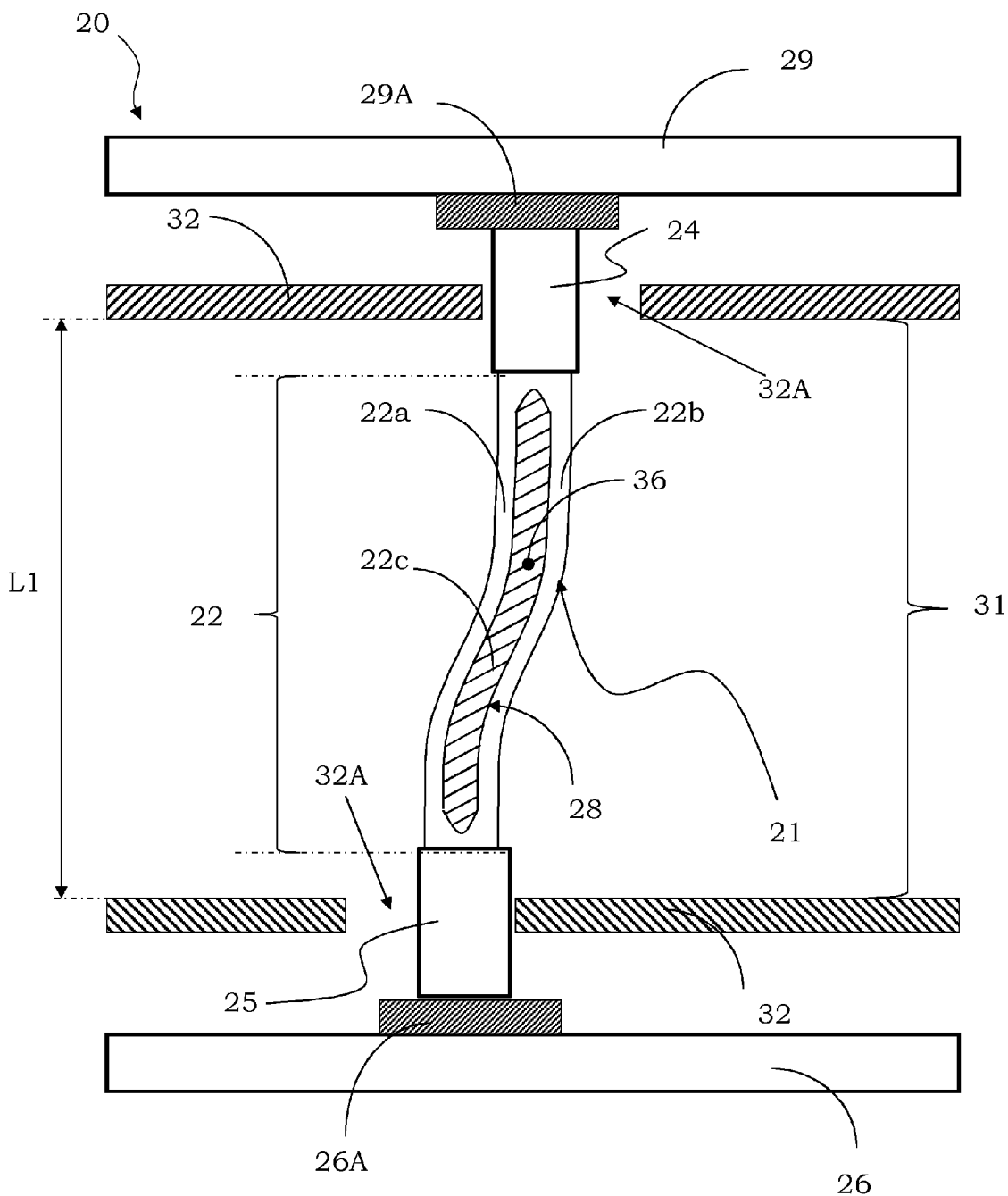

It is also possible to realize the testing head 20 of the so-called shifted plates type, as schematically shown in FIG. 7B; in that case, the testing head 20 includes at least one plate-shaped support or lower guide 32, usually called "lower die", and at least one plate-shaped support or upper guide 33, usually called "upper die", being flat and parallel to each other and provided with respective guide holes, 32A and 33A, inside which a plurality of contact probes are slidingly housed, in the figure being always shown only one for the sake of simplicity. Between the upper and lower guides 33 and 32 there is defined a gap 31 of length L, for example between 1000 μm and 4000 μm, preferably between 2000 μm and 3000 μm.

In the example shown in FIG. 7B, the testing head 20 is also of the non-fastened probes type and the contact head 24 of each contact probe 21 is suitable to abut onto contact pads 29A of a space transformer 29.

Also in that case, each contact probe 21 includes an opening 28, extending along the body 22, in the example substantially for all the length of the same, again purely by means of an example, in a substantially central position.

Therefore the body 22 of the contact probe 21 is formed by at least one first and one second lateral portion, 22a and 22b, substantially parallel and joined to each other by a central portion 22c at the opening 28.

Conveniently, the opening 28 is filled with the filling material 36, in order to realize a strengthening structure of the body 22 of the contact probe 21.

It should be underlined that in that way it is possible to realize testing heads 20 including short probes, and therefore suitable for high frequency applications, the use of the opening 28 being able to reduce the stiffness of the body of those contact probes 21 and at the same time reduce the impact pressure of the contact tip 25 of the probe on a contact pad 26A of the device under test 26 and the filling with a material 36, particularly a polymeric material allows preventing the development of cracks or cuts in the body 22 of the contact probe 21.

Conveniently, the contact probes 21 provided with the openings 28 filled with filling material 36 can be realized having higher diameters with respect to traditional contact probes without those openings, without risks of breaking the probes themselves or the pads they are contacting.

Figure 8:
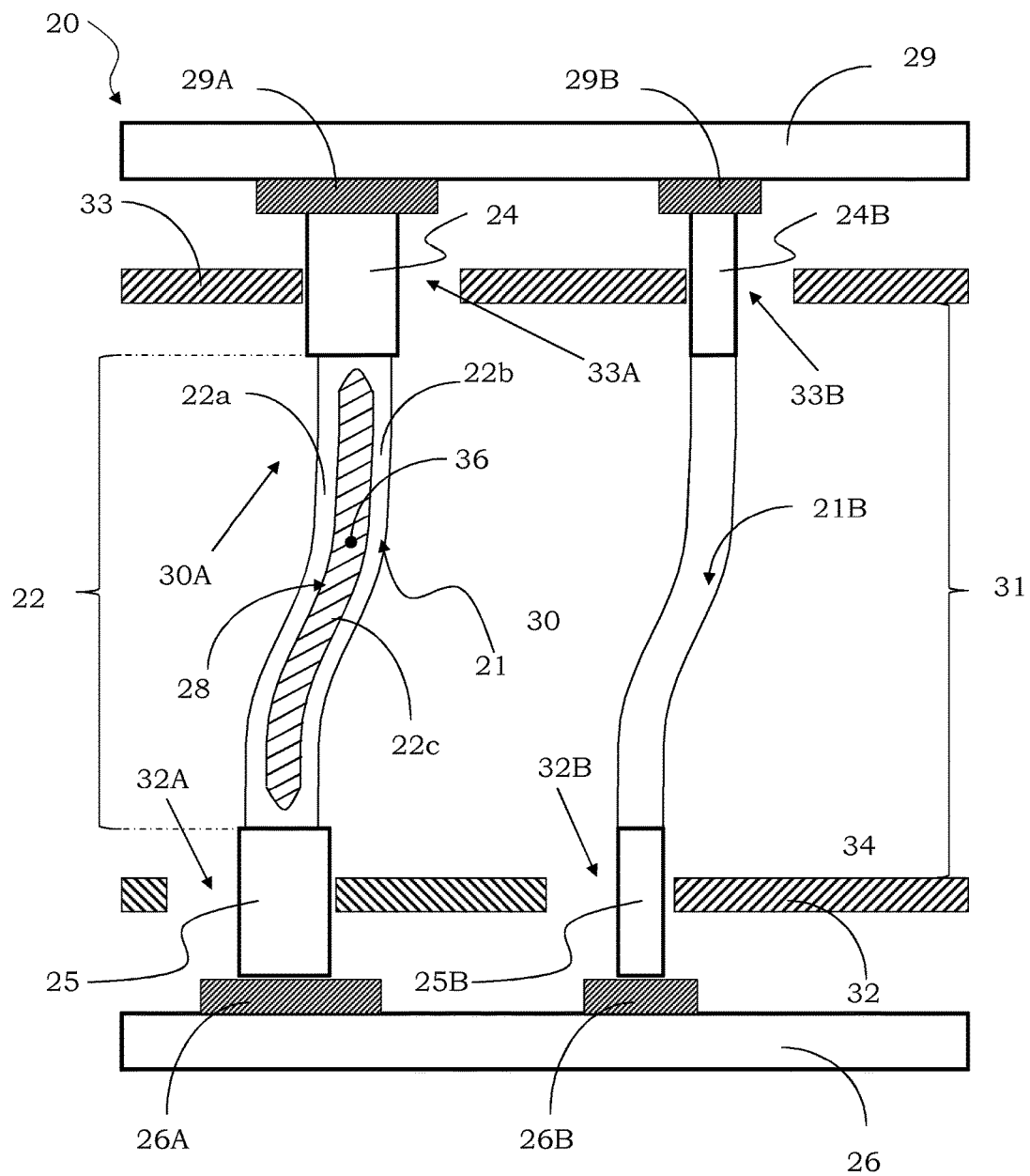
FIG. 8 schematically shows a preferred embodiment of the testing head according to the disclosure.

One particularly advantageous embodiment of the testing head 20 according to the present disclosure is schematically shown in FIG. 8.

The testing head 20 particularly includes a plurality of contact probes 21 provided with openings 28 filled with filling material 36 and being realized as described above together with a plurality of contact probes, shown with 21B, being realized in a traditional way and therefore not provided with any longitudinal opening.

In the example shown in the figure, the testing head 20 is of the shifted plates type and therefore includes the lower guide 32 and the upper guide 33, being flat and parallel to each other and provided with further respective guide holes, 32B and 33B, inside which the contact probes 21B without openings are slidingly housed.

More particularly, each contact probe 21B without opening includes a contact head 24B suitable to abut onto further contact pads 29B of the space transformer 29, as well as a contact tip 25B suitable to abut onto further contact pads 26B of the device under test 26.

It should be underlined that the contact probes 21 and 21B of the testing head 20 shown in FIG. 8 substantially have the same length. However, the contact probes 21B without openings have a probe diameter less than the corresponding probe diameter of the contact probes 21 provided with the openings 28 filled with filling material 36. Right thanks to the presence of the openings 28 filled with filling material 36, the contact probes 21 with the greater diameter however have enough elasticity to ensure a proper operation and enough useful life to the testing head 20 including them.

It should be underlined that therefore it is possible, using the same testing head 20 being realized as shown in FIG. 8, to test integrated devices having regions with a different pitch.

Actually, it is known that the most recent development of the technology used to realize integrated circuits allowed realizing devices with bidimensional arrays of contact pads having different relative distances or pitches in different regions of the device itself. More particularly, those regions having a different pitch also include contact pads having different dimensions, dedicated to handle signals having different characteristics.

More particularly such a device includes a first region, called power region, where the contact pads have greater transversal dimension and distance between the corresponding centers with respect to a second region, called signal region, where the pads are smaller and closer to each other. In that case, they are referred to as multi-pitch devices.

Generally, in the first power region there are handled supply signals having high current values, in the range of 1 A, while in the second signal region there are handled input/output signals having lower current values, particularly in the range of 0.5 A.

Conveniently, the testing head 20 according to the present disclosure as shown in FIG. 8 allows carrying out the testing of those devices, particularly using the contact probes 21 provided with the openings 28 filled with filling material 36 in the first power region and the contact probes 21B without openings in the second signal region, all the probes having the same length. In that way, the testing of multi-pitch devices is carried out.

Figure 9A:
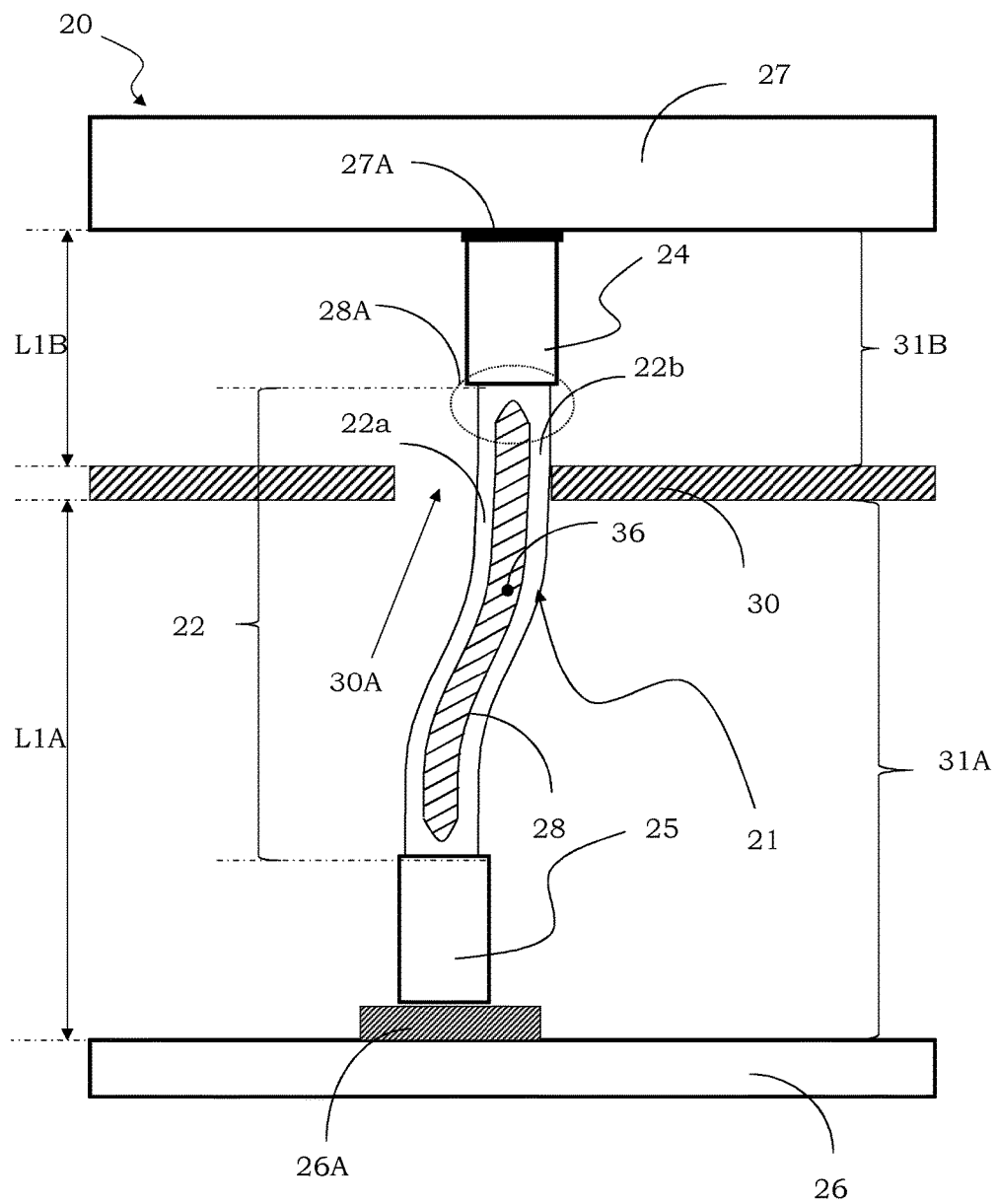
FIGS. 9A-9C and 10A-10B schematically show alternative embodiments of the testing head according to the disclosure.

According to a further alternative embodiment, schematically shown in FIG. 9A, the testing head 20 is of the type with fastened probes and further includes at least one plate-shaped support or auxiliary guide 30, arranged along the body 22 in parallel to a plane defined by the support 27 or also by the device under test 26, being usually flat and parallel to each other, and provided with suitable guide holes 30A and one contact probe 21 sliding inside each of them.

In that way, there is defined an additional gap 31B, between the auxiliary guide 30 and the support 27, in addition to a gap 31A between the auxiliary guide 30 and the device under test 26. Conveniently, in the additional gap 31B there is placed at least one end portion of the opening 28 being realized in the contact probe 21, which can be considered a critical portion 28A of the contact probe 21 where it is more likely that cracks or breakings occur, even if the filling material 36 is present.

Particularly, the critical portion 28A corresponds to a portion of the probe where a clear change in the cross-section occurs therefore determining a remarkable concentration of mechanical stresses.

Referring to the embodiment and to the local reference of FIG. 9A, the auxiliary guide 30 is arranged along the body 22 under the critical portion 28A and near the same.

It should be underlined that the additional gap 31B so defined by the auxiliary guide 30 defines a portion of the contact probe 21 with low bending stresses, particularly lower than those of the gap 31A, which reduces the likelihood of breaking right at the critical portion 28A contained in that additional gap 31B.

Conveniently, the gap 31A has a length L1A, defined as the distance between an undercut surface of the auxiliary guide 30 and a surface of the device under test 26 including the contact pads 26A; the length L1A of the gap 31A is between 1000 μm and 4000 μm, preferably between 2000 μm and 3000 μm. In a similar way, the additional gap 31B has a length L1B, defined as the distance between a surface opposing the undercut surface of the auxiliary guide 30 and a surface of the support 27 to which the contact head 24 of the contact probe 21 is connected, particularly soldered; the length L1B of the additional gap 31B is between 100 μm and 500 μm, preferably between 200 μm and 300 μm.

Advantageously according to the present disclosure, the use of the auxiliary guide 30 suitable to define an additional gap 31B where the contact probe 21 undergoes low or even no bending stresses and including a critical portion 28A, namely a zone more prone to breaking, being introduced in the body 22 by the opening 28, allows realizing a testing head 20 with short vertical probes, namely having lengths less than 5000 μm, therefore being suitable for high frequency applications, with a useful life comparable if not longer than those of the known testing heads, reducing if not nulling the likelihood of breaking that probe at that critical portion 28A.

Figure 9B:
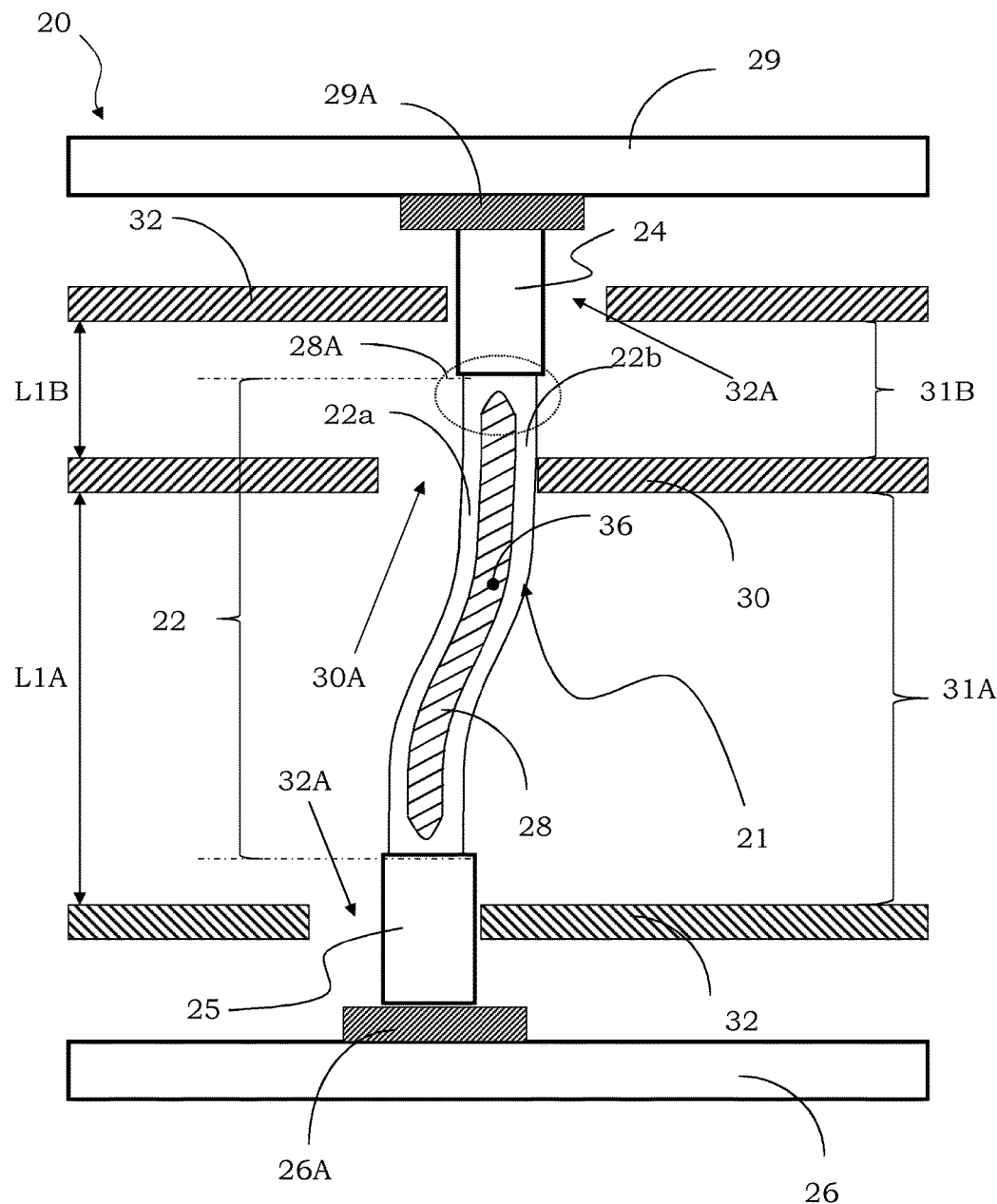

It is also possible to realize the testing head 20 of the so-called shifted plates type, as schematically shown in FIG. 9B; in that case, the testing head 20 includes at least one lower guide 32 and one upper guide 33, being flat and parallel to each other and provided with respective guide holes, 32A and 33A, inside which a plurality of contact probes are slidingly housed, for the sake of simplicity, in the figure there is always shown only one of them, particularly being non fastened and provided with a contact head 24 suitable to abut onto contact pads 29A of a space transformer 29.

Also in that case, each contact probe 21 includes an opening 28, extending along the body 22, substantially for all the length of the same and it is filled with filling material 36, that body having reduced dimensions, particularly having a length less than 5000 μm, and therefore being suitable for high frequency applications.

According to the alternative embodiment shown in FIG. 9B, the testing head 20 also includes at least a plate-shaped support or auxiliary guide 30, arranged along the body 22 in parallel with the planes of the lower and upper guides, 32 and 33, being in turn parallel to the planes of the device under test 26 and the space transformer 29, usually being parallel to each other. Also in that case, there are defined a gap 31A between the auxiliary guide 30 and the lower guide 32, not including a critical portion 28A at one end of the opening 28 filled with filling material 36 and an additional gap 31B, between the auxiliary guide 30 and the upper guide 33, where instead is placed the critical portion 28A, for example near the contact head 24.

In that case too, the additional gap 31B corresponds to a portion of the contact probe 21 with low bending stresses, which reduces the likelihood of breaking the body 22 at the critical portion 28A contained therein.

The gap 31A has a length L1A, defined as the distance between an undercut surface of the auxiliary guide 30 and a surface of the lower guide 32 internal to the gap 31 itself; as above, the length L1A can have values between 1000 μm and 4000 μm, preferably between 2000 μm and 3000 μm.

The additional gap 31B has a length L1B, defined as the distance between a surface opposing the undercut surface of the auxiliary guide 30 and an undercut surface of the upper guide 33; the length L1B of the additional gap 31B can have values between 100 μm and 500 μm, preferably between 200 μm and 300 μm.

Figure 9C:
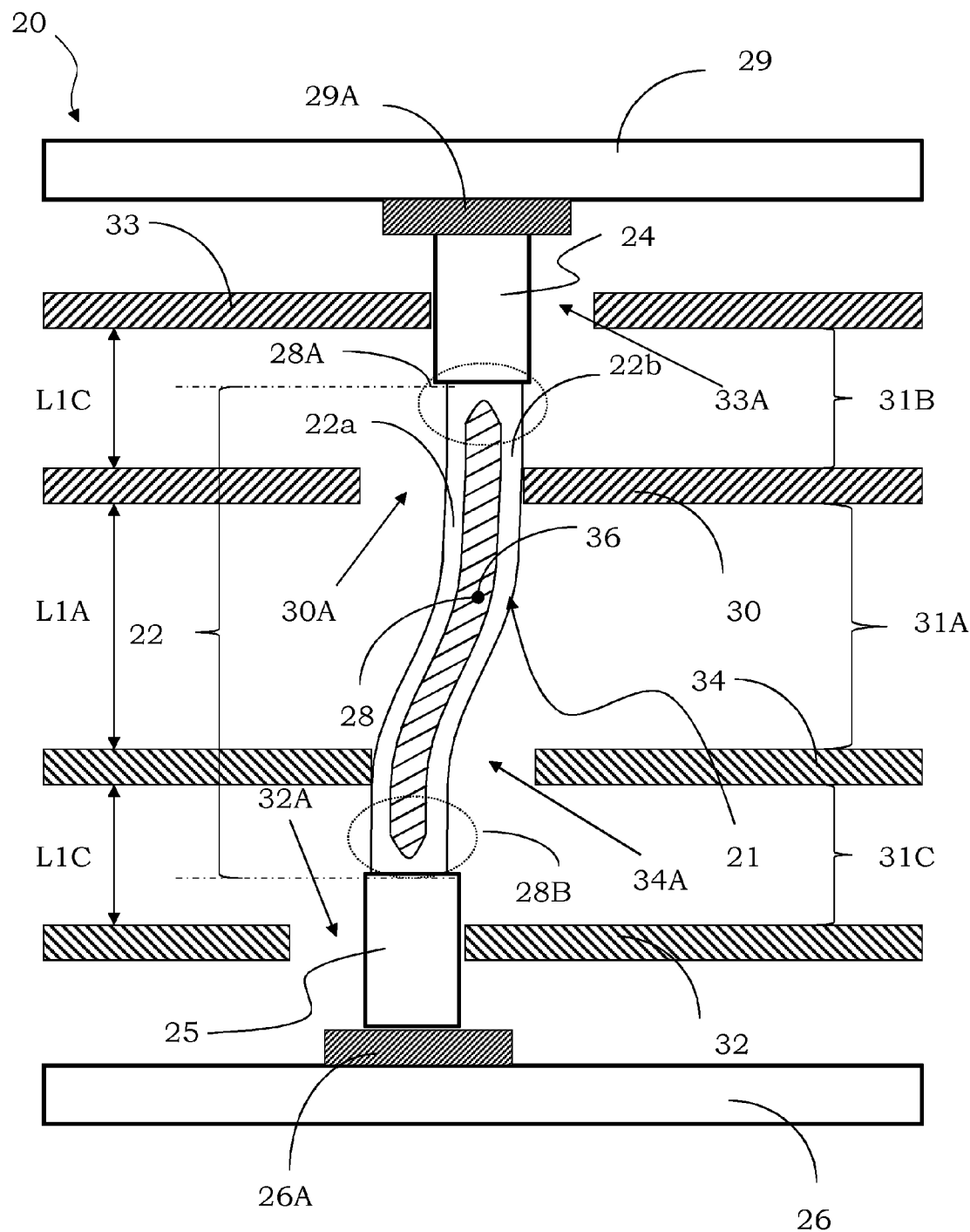

According to an alternative embodiment shown in FIG. 9C, the testing head 20 can also include at least one further auxiliary guide 34, arranged along the body 22 in parallel with the planes of the lower, upper and auxiliary guides, 32, 33 and 30, being in turn flat and parallel to each other and to the planes of the device under test 26 and of the space transformer 29, usually being parallel to each other, and particularly arranged between the auxiliary guide 30 and the lower guide 32.

Such a further auxiliary guide 34 is able to define a further additional gap 31C, enclosing a further critical portion 28B of the body 22 which is prone to breakings, being arranged at a further end of the opening 28 near the contact tip 25.

In other words, referring to the embodiment and to the local reference of FIG. 9C, the further auxiliary guide 34 is arranged along the body 22 over the critical portion 28B and near the same.

In that case too, the further additional gap 31C corresponds to a portion of the contact probe 21 with low bending stresses, which reduces the likelihood of breaking the body 22 at the critical portion 28B contained therein.

Clearly, it is possible to consider a testing head 20 including an auxiliary guide 30 arranged between the upper guide 33 and the lower guide 32 in order to define the additional gap 31B, between the auxiliary guide 30 and the upper guide 33, where the critical portion 28A is placed, at one end of the opening 28 near the contact head 24.

In a similar way, in that case the testing head 20 could include a further auxiliary guide 34, arranged between the auxiliary guide 30 and the lower guide 32 in order to define a further additional gap 31C, enclosing a further critical portion 28B of the body 22 which is prone to breakings, being arranged at a further end of the opening 28 near the contact tip 25.

Referring to the example shown in the figure, due to the presence of the auxiliary guide 30 and of the further auxiliary guide 34, there are defined one gap 31A between the auxiliary guide 30 and the further auxiliary guide 34, not including the critical portions 28A and 28B, one additional gap 31B, between the auxiliary guide 30 and the upper guide 33, where the critical portion 28A is placed and one further additional gap 31C, between the further auxiliary guide 34 and the lower guide 32, where the further critical portion 28B is placed.

Clearly, in that case the length L1A of the gap 31A is defined as the distance between the walls of the auxiliary guide 30 and the further auxiliary guide 34 facing inside it, while the further additional gap 31C has a length L1C intended as the distance between the walls of the further auxiliary guide 34 and the lower guide 32 facing inside it.

It is possible to consider the same ranges of values shown above for the embodiment of the FIG. 9B for the length L1B of the additional gap 31B also for the length L1C of the further additional gap 31C.

It should be underlined that the embodiment of the testing head 20 shown in FIG. 9C further reduces the likelihood of breaking due to stresses, particularly the bending ones, of the contact probes 21 provided with respective openings 28 even if they are filled with filling material 36, making them suitable for high frequency applications, thanks to the placement of the auxiliary guide 30 and the further auxiliary guide 34 enclosing the critical portions 28A and 28B in zones with low or very low stresses, particularly the bending ones. Therefore, it is expected that the testing head 20 have a proper useful life duration, particularly longer than the known solutions.

Finally, tests made by the applicant, have been able to verify how the presence of the auxiliary guide 30 in addition to the upper guide 33, in case of a testing head of the shifted plate type, significantly increases the sliding of the contact probes 21 inside the respective guide holes, 30A and 33A.

In that case, it is well known to move the lower guide 32 and the upper guide 33 with respect to each other in order to realize a desired bending of the body 22 of the contact probe 21. Furthermore, again similarly to the known art and as shown above, it is also possible to move the upper guide 33 and the auxiliary guide 30 with respect to each other in order to realize the desired holding of the probes inside the testing head 20. However, the holding of the contact probes 21 obtained with the relative movement of the upper guide 33 and the auxiliary guide 30 is non able to prevent the contact probes 21 from sliding outside the testing head 20 in the absence of a device under test 26 or a space transformer 29. Similar considerations can be made taking in account the lower guide 32 and the further auxiliary guide 34, if present.

Figure 10A:
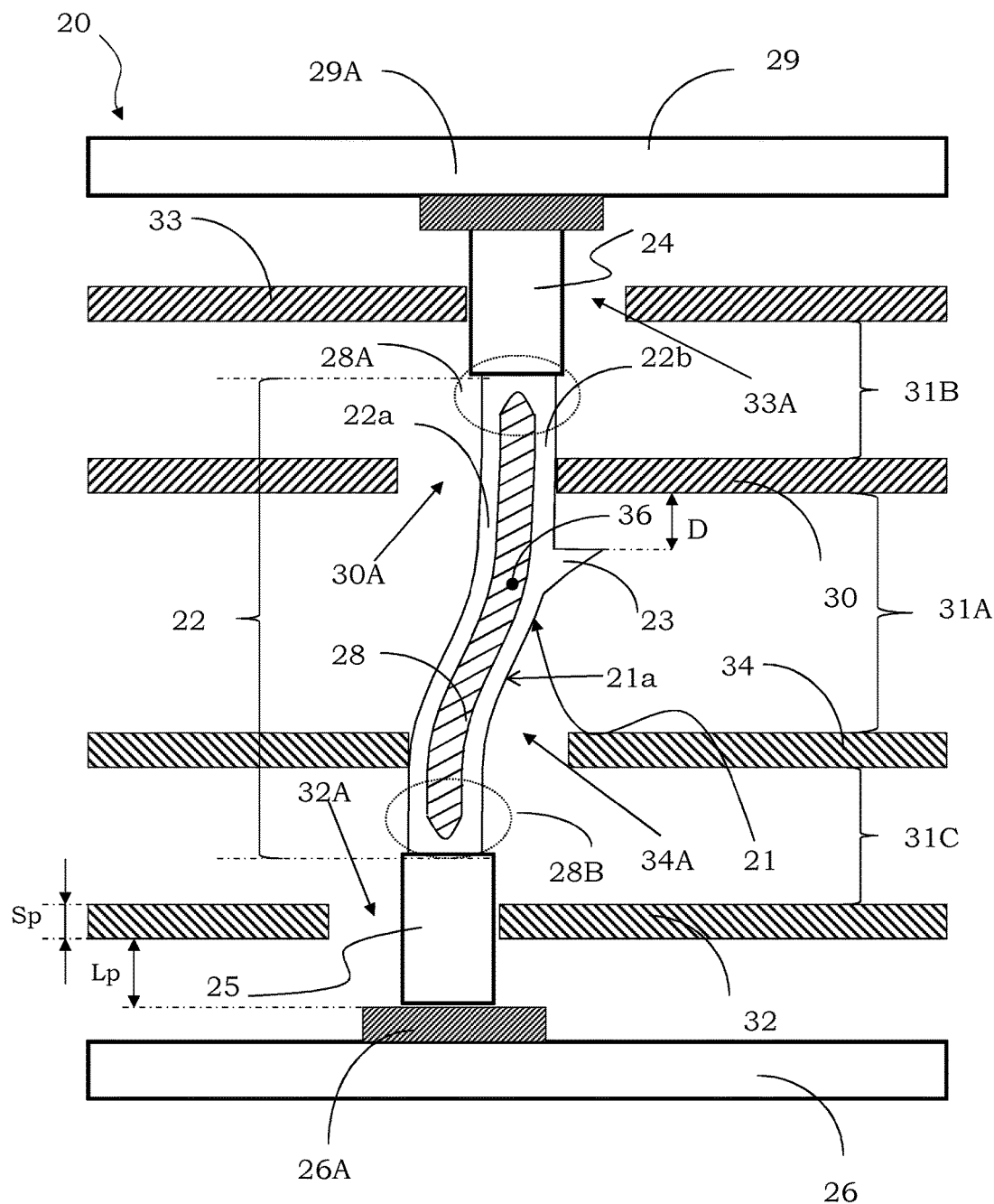

Advantageously according to an alternative embodiment of the testing head 20 of the present disclosure, schematically shown in FIG. 10A, the contact probe 21 also includes at least one element protruding from the respective body 22, at one of its walls. That protruding element is particularly used to realize stopping means of the contact probe 21 suitable to prevent the contact probe 21 from coming out form the testing head 20 also in the absence of a device under test 26 or a space transformer 29 and it will be indicated in the following as stopper 23.

Particularly, as it will be explained in the following of the description, the stopper 23 is able to prevent an upwards movement (in the local reference of FIG. 9A) of the corresponding contact probe 21.

In a preferred embodiment being shown in the figure, the stopper 23 is tooth-shaped, being integral with the body 22 of the contact probe 21. Furthermore, the stopper 23 protrudes from the body 22 with a lateral protrusion whose dimension is comparable to the diameter of the contact probe 21 and particularly is between 5 and 40 µm, where with comparable it is meant that the difference between that overall lateral dimension and the diameter of the contact probe 21 is less than 20%. Moreover, it should be recalled that with the term diameter it is meant, herein and in the following, a maximum transversal dimension of a corresponding cross-section, also in case of non-circular cross-sections.

In the embodiment shown in FIG. 10A, the stopper 23 is placed in the gap 31A protruding from a wall 21a of the contact probe 21 suitable to contact a wall of a guide hole 30A of the auxiliary guide 30 above it.

It should be underlined that the stopper 23 is placed along the body 22 of the contact probe 21 so that, during the normal operation of the corresponding testing head 20, the stopper 23 is not contacting the auxiliary guide 30, in order not to interfere with the movement of the corresponding contact probe 21. In that way, the stopper 23 only acts on the occasion of a possible upwards movement of the contact probe 21, for example in case of the removal of the space transformer 29 and the undesired even if temporary "sticking" between the contact heads 24 of the probes and the contact pads 29A of the space transformer 29.

Actually, the stopper 23 is placed at the wall of the guide hole 30A of the auxiliary guide 30 which exactly abuts onto the wall 21a of the contact probe 21 from which the stopper 23 protrudes, guaranteeing that the same abuts onto the undercut surface of the auxiliary guide 30 if the contact probe 21 tries to move upwards, again in the local reference of FIG. 10A.

It should be also underlined that the stopper 23 is able to prevent undesired movements of the contact probes 21 on the occasion of cleaning operations of the testing head 20, which are usually carried out by means of powerful air jets, particularly being able to move the contact probes, the movements being encouraged by the enhanced sliding of the probes in the guide holes due to the presence of the auxiliary guide 30.

Furthermore, being not shown because conventional, the contact head 24 can be realized in order to have greater dimensions than the diameter of the guide holes 33A being realized in the upper support 33, preventing a downwards sliding (in the local reference of FIG. 10A) of the corresponding contact probe 21.

In one alternative embodiment, the contact probe 21 includes at least one stopper 23' being realized protruding from a further wall 21b opposite to the wall 21a and placed in the additional gap 31B; particularly, the further wall 21b is suitable to contact a wall of a guide hole 33A of the upper guide 33 above it.

It should be underlined that the placement of the stopper 23' between the upper guide 33 and the auxiliary guide 30, namely in the additional gap 31B, is particularly advantageous since it is a zone with reduced stresses, particularly almost free from bendings. In that way, there is no risk to trigger undesired breakings just at the stopper 23', whose shape protruding from the wall of the contact probe 21 inevitably introduces stress accumulation points.

It is necessary to underline that the guide holes being realized in the different guides, 32, 33, 30 or 34 are properly sized in order to allow the passage of the contact probe 21 also at the stopper 23 and or 23'.

More particularly, the guide holes are made with a diameter that corresponds to the sum of the diameter of the contact probe 21 and the overall lateral dimension of the stopper 23 or 23', plus a value accounting for the process tolerances.

Figure 10B:
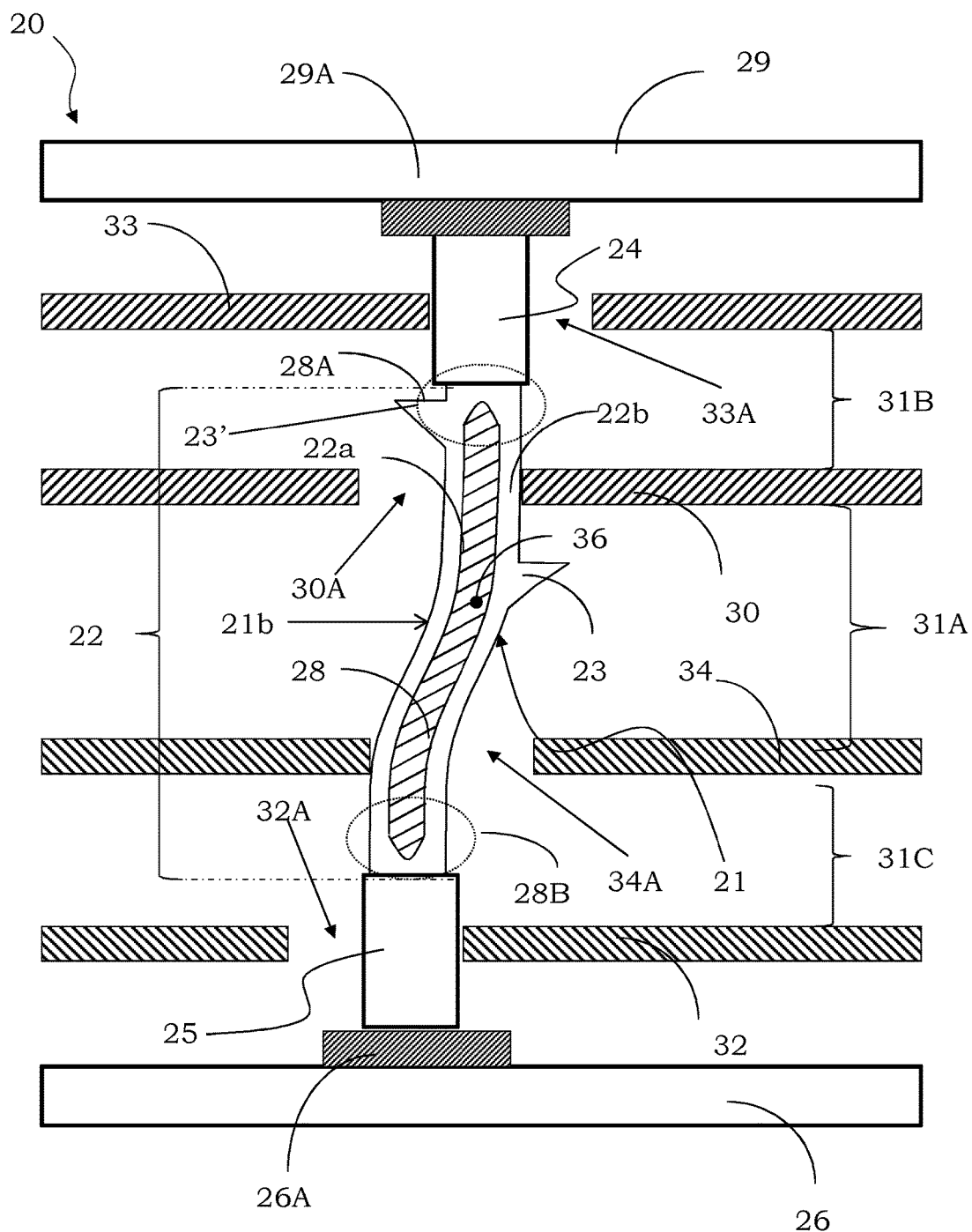

In the example shown in FIG. 10B, the contact probe 21 includes the stopper 23 placed in the gap 31A and a further stopper 23' placed in the additional gap 31B, being protruding from opposite walls 21a and 21b of the contact probe 21.

With such a configuration, both the stoppers 23, 23' are contacting the wall of a respective guide hole at the wall of the contact probe 21 and therefore guarantee an enhanced holding of the contact probe 21 inside the testing head 20 and prevent any possible upwards movement thereof with a double force.

In that case, the guide holes are made with a diameter that corresponds to the sum of the diameter of the contact probe 21 and the overall lateral dimension of the stopper 23 or 23', plus a value accounting for the process tolerances.

Alternatively, it is possible to consider that those stoppers 23 and 23' protrude starting from the same wall 21a or 21b of the contact probe 21.

Actually in that way, at least one of the stoppers 23 and 23' is prevented in its movement through the guide holes because it is contacting a wall of the contact probe 21 at a wall of the guide hole, independently from the bending of the probe itself, usually called mounting angle of the probe, while the embodiment shown in FIG. 10B can be used for a single mounting angle of the contact probe 21.

Moreover, the stoppers 23, 23' introduce an overall dimension in the same direction, therefore guaranteeing the minimization of the value of minimum diameter that should be considered when realizing the guide holes of the guide 32, 33, 30 and possibly 34.

According to a further embodiment (not shown), the contact probe 21 can include at least four stoppers protruding from the walls of the contact probe 21 and being arranged in pairs in the additional gap 31B and gap 31A, respectively.

In that way, it is possible to guarantee an enhanced holding due to the fact that a pair of stoppers is always suitable to abut onto an undercut wall of the guide on the occasion of an undesired upwards movement of the contact probe 21, independently from its mounting angle.

Again, it should be underlined that, in all the alternative embodiments being described, during the normal operation of the testing head 20, the stopper 23 and/or 23' is not contacting the guides 33 or 30, in order not to interfere with the movement of the corresponding contact probe 21. Conveniently, the stopper 23 instead acts in order to prevent an upwards movement of the contact probe 21, for example on the occasion of the removal of the space transformer 29 or of cleaning operations of the testing head 20.

Moreover, the stopper 23 can be advantageously placed at a distance D greater than a minimum value equal to 5-10 μm, in order to guarantee that the stopper 23 does not interfere with the normal operation of the testing head 20 including the contact probe 21. In order to avoid any interference problem, the distance D preferably is chosen in order to be greater than 100 μm, more preferably greater than 150 μm.

The stopper 23 is suitably placed in order to prevent the contact tip 25 of the contact probe 21 from being able to come out from the lower support 32, particularly from the corresponding guide hole 32A. Actually, the contact tip 25 coming out makes the testing head 20 including such a contact probe 21 unusable, without a new alignment of the guide hole 32A to the contact tip 25 once the contact probe 21 is put back in position.

Therefore, the stopper 23 is placed at a distance D from the guide over it, for example the auxiliary guide 30 as in the case shown in FIG. 10A, particularly from the undercut wall of that auxiliary guide 30, having a value less than the sum of the length Lp of the contact tip 24 protruding from the lower guide 32 outside the testing head 20 and the thickness Sp of the lower guide 32, particularly corresponding to the height of the corresponding guide hole 32A, namely D<Lp+Sp. It should be underlined that the suitable placement of the stopper 23 is particularly advantageous in the case of the contact probes of the buckling beams type; actually in that case, the possible extraction of the contact tip 25 of a contact probe 21 from the guide hole 32A of the lower guide 32 causes a sudden straightening of the probe itself, which would prevent any attempt of putting back in position the same.

In conclusion, it is possible to realize the so-called short contact probes, namely with a body having a length less than 5000 μm, and therefore suitable for high frequency applications, but being provided with such an elasticity being able to reduce, if not nulling, the likelihood of breaking the probe itself.

Particularly, the presence of pass-through openings being realized in the probe body and suitably filled with filling material, for example a polymeric one, allows increasing the elasticity of the probe body, reducing the risks of breakings and also the pressure that the corresponding contact tip exerts on a contact pad of a device under test, also when the contact probe has reduced dimensions being suitable for high frequency applications.

In that way, it is possible to realize testing heads having operating proprieties that are particularly performing and suitable to their use in high frequency applications, particularly at frequencies higher than 1000 MHz, thanks to the reduced dimensions of the bodies of the probes being included therein, whose length are less than 5000 μm and thanks to the presence of an opening filled with filling material in the body of the contact probes that allows reducing the stiffness of those probes, drastically reducing the likelihood of breaking the probes themselves and guaranteeing at the same time a proper reduction of the pressure being exerted by the corresponding contact tips, avoiding any breaking of the contact pad of the devices under test.

According to a preferred embodiment, the testing head according to the present disclosure allows performing the testing of multi-pitch devices, particularly by using contact probes provided with cavities in a first power region, where there are contact pads having greater dimensions and pitch, and contact probes without cavities in a second signal region of the device, where there are contact pads having smaller dimensions and pitch, all the probes having the same length.

Conveniently, according to an alternative embodiment of the testing head according to the disclosure, the combined use of the opening filled with filling material and at least one auxiliary guide suitable to define a zone with low or very low stresses of the body of the probes, being suitably placed in order to include one or more critical portions of that body, intended as the zones that are more prone to breakings, due to the presence of the opening, allows obtaining a testing head suitable for high frequency applications with a proper useful life, particularly comparable if not longer than that of the known solutions.

Moreover, the presence of at least two guides including suitable guide holes for the sliding of the contact probes, allows enhancing that sliding and guaranteeing the absence of undesired blockages of the probes.

It should be underlined that the reduction of the friction forces inside the testing head translates in an enhanced operation of the same, as well as in an extended life of the individual components, with a consequent cost saving.

Furthermore, the presence of at least one stopper guarantees the proper operation of the testing head, particularly the placement and the proper holding of the contact probes being included therein.

Particularly, the stopper is able to prevent undesired movements of the contact probes on the occasion of cleaning operations of the testing head, which usually are carried out by means of powerful air jets, particularly being able to move the contact probes and to keep the contact probes inside the testing head also on the occasion of the space transformer removal, the counter-force being realized by the abutment of the stopper onto a corresponding undercut wall of the guide of the upper support guaranteeing to break any oxide that hold the contact heads to the pads of the space transformer itself.

Again, it should be underlined that, during the normal operation of the testing head, the stopper is not contacting the guides, and therefore it does not interfere with the movement of the corresponding contact probe. Conveniently, the stopper only acts in case of an undesired movement attempt of the contact probe towards the space transformer.

Particularly, the stopper is placed in order to prevent the contact tip of the contact probe from being able to come out from the lower guide, particularly from the corresponding guide hole, which would make the testing head quite unusable, particularly in case of the buckling beams technology.

It should be noted the advantage due to the fact that the contact probes are manufactured easily and at low costs, with the respective stopping means or stoppers being integrally manufactured directly from mold by means of conventional photolithographic technologies, or by means of MEMS (Micro Electro-Mechanical System) technologies, or also with a laser technology.

The above considerations also still apply for different embodiments not explained herein but being however an object of the present disclosure, such as, for example, a testing head having a plurality of cavities and only one auxiliary guide or having stoppers being arranged near the lower guide or also an overall greater number of guides. Moreover, the expedients implemented relative to one embodiment are also usable for other embodiments and are freely combinable with each other also in a number greater than two.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A contact probe of a testing head for a testing apparatus of electronic devices comprising:
 a probe body having a length of less than 5000 μm;
 a first end portion being a contact tip of the contact probe and configured to abut onto a contact pad of a device under test;
 a second end portion being a contact head of the contact probe and configured to abut onto a contact pad of a space transformer;
 the probe body extending in a longitudinal direction between the end portions and comprising a pass-through opening, extending along a longitudinal dimension of the probe body,
 wherein the pass-through opening is filled by a filling material defining first and second lateral portions in the probe body,
 the first and second lateral portions being parallel and joined to each other by a connecting central portion of the filling material at the first pass-through opening, and
 the connecting central portion of the filling material acting as a first strengthening element of the contact probe.

2. The contact probe of claim 1, wherein:
 the pass-through opening is one of a plurality of pass-through openings provided in the probe body,
 the pass-through openings are parallel to each other, and define a plurality of lateral portions, including the first and second lateral portions, in the probe body, and
 the pass-through openings are filled by the filling material to form connecting central portions acting as strengthening elements.

3. The contact probe of claim 2, further comprising a plurality of material bridges arranged inside one or more of the pass-through openings.

4. The contact probe of claim 3, wherein the material bridges are placed at one end of the pass-through openings.

5. The contact probe of claim 1, further comprising:
 a material bridge arranged inside the pass-through opening and connecting the lateral portions to each other on sides of the pass-through opening.

6. The contact probe of claim 5, wherein the material bridge is placed at one end of the pass-through opening.

7. The contact probe of claim 1, further comprising a protruding element or stopper originating from a lateral wall of the probe body.

8. The contact probe of claim 6, wherein the stopper has a lateral extension having a dimension comparable to a diameter of the contact probe comprised between 5 and 40 μm.

9. The contact probe of claim 1, wherein the filling material is chosen among a polymeric material, Parylene®, an inorganic dielectric material and alumina.

10. The contact probe of claim 9, wherein the filling material coats the entire contact probe.

11. A testing head for functionality testing a device under test comprising a plurality of first contact probes, each first contact probe including:
 a probe body having a length of less than 5000 μm,
 a first end portion being a contact tip of the contact probe configured to abut onto a contact pad of a device under test,
 a second end portion being a contact head of the contact probe abutting onto a contact pad of a space transformer,
 the probe body extending in a longitudinal direction between the end portions and comprising a pass-through opening, extending along a longitudinal dimension of the probe body, wherein a filling material is positioned in the pass-through opening, the filling material defining first and second lateral portions in the probe body, the first and second lateral portions being parallel and joined to each other by a connecting central portion of the filling material at the pass-through opening, and the connecting central portion of the filling material acting as a strengthening element of the contact probe.

12. The testing head of claim 11, wherein the first contact probes are configured to abut onto first contact pads of a power region of the device under test, the testing head further comprising:

second contact probes, without pass-through openings, configured to abut onto second contact pads of a signal region of the device under test, the first contact pads having greater dimensions and pitch than the second contact pads and the second contact probes without pass-through openings have a probe diameter smaller than a probe diameter of the first contact probes.

13. The testing head of 11, further comprising:
a first auxiliary guide, arranged transversely to the probe bodies of the contact probes and comprising suitable guide holes wherethrough the contact probes slide, and
a first gap defined by the first auxiliary guide,
the first gap including one end of the pass-through opening, being a critical portion of the probe body of each contact probes and a zone more prone to breakings in the body,
the critical portion being positioned in the first gap so that the critical portion undergoes low or even no bending stresses with respect to the rest of the probe body of each contact probe.

14. The testing head of claim 13, further comprising;
a support, the contact probes having contact heads fixedly coupled to the support at a contact area, the first gap being defined between the first auxiliary guide and the support, and
a second gap defined between the first auxiliary guide and the contact tips.

15. The testing head of claim 13, further comprising:
a lower guide comprising a first plurality of guide holes, and
an upper guide comprising a second plurality of guide holes,
the lower and upper guides being flat and parallel to each other,
each contact probe being housed in respective guide holdes of the first and second pluralities of guide holes,
the first gap including one end of each pass-through opening and being defined between the first auxiliary guide and the upper guide or the lower guide.

16. The testing head of claim 15, further comprising:
a second auxiliary guide arranged along the body of the contact probes, in parallel to the planes of the lower, upper and first auxiliary guides and comprising suitable guide holes wherethrough the contact probe slide, the second auxiliary guide being positioned between the first auxiliary guide and the lower guide or the upper guide respectively,
a third gap defined between the second auxiliary guide and the lower guide or the upper guide respectively, a further end of the pass-through opening of each contact probe being included in the third gap and being a further critical portion of the body of the contact probe, and
a fourth gap defined between the first auxiliary guide and the second auxiliary guide, the fourth gap not comprising the critical portions of the bodies.

17. The testing head of 11, wherein each contact probe comprises at least one protruding element or stopper originating from a lateral wall of the contact probe, which contacts one wall of a guide hole of a guide above the protruding element or stopper.

18. A contact probe of a testing head for a testing apparatus of electronic devices comprising:
a probe body having a length of less than 5000 μm,
a first end portion being a contact tip of the contact probe and configured to abut onto a contact pad of a device under test
a second end portion being a contact head of the contact probe and configured to abut onto a contact pad of a space transformer, the probe body extending in a longitudinal direction between the end portions and comprising a pass-through opening, extending along its longitudinal dimension,
a filling material positioned in the pass-through opening and defining first and second lateral portions in the probe body,
the first and second lateral portions being parallel and joined to each other by a connecting central portion of the filling material at the pass-through opening
the connecting central portion of the filling material acting as a strengthening element of the contact probe, and
the filling material being also a coating layer that coats the body of the contact probe.

19. The contact probe of claim 18, wherein:
the pass-through opening is one of a plurality of pass-through openings provided in the probe body,
the pass-through openings are parallel to each other, and define a plurality of lateral portions, including the first and second lateral portions, in the probe body, and
the filling material is positioned in the pass-through openings to form connecting central portions acting as strengthening elements.

20. The contact probe of claim 19, further comprising a plurality of material bridges arranged inside one or more of the pass-through openings.

21. The contact probe of claim 20, wherein the material bridges are placed at one end of the pass-through openings.

22. The contact probe of claim 18, further comprising:
a material bridge arranged inside the pass-through opening and connecting the lateral portions to each other on sides of the pass-through opening.

23. The contact probe of claim 22, wherein the material bridge is placed at one end of the pass-through opening.

24. The contact probe of claim 18, further comprising a protruding element or stopper originating from a lateral wall of the probe body.

25. A contact probe of a testing head for a testing apparatus of electronic devices comprising:
a probe body having a length of less than 5000 μm,
a first end portion being a contact tip of the contact probe and configured to abut onto a contact pad of a device under test,
a second end portion being a contact head of the contact probe and configured to abut onto a contact pad of a space transformer,
the probe body extending in a longitudinal direction between the end portions and comprising a pass-through opening, extending along a longitudinal dimension of the probe body, wherein the pass-through opening is filled by a filling material defining first and second lateral portions in the probe body, the first and second lateral portions being parallel and joined to each other by a connecting central portion of the filling material at the pass-through opening, the connecting central portion of the filling material acting as a strengthening element of the contact probe, the filling material being also a coating layer that coats the body of the contact probe, and a material bridge arranged inside the pass-through opening and connecting the lateral portions to each other on sides of the pass-through opening.

26. The contact probe of claim 25, wherein:

the pass-through opening is one of a plurality of pass-through openings provided in the probe body, the pass-through openings are parallel to each other, and define a plurality of lateral portions, including the first and second lateral portions, in the probe body, and the pass-through openings are filled by the filling material to form connecting central portions acting as strengthening elements.

27. The contact probe of claim 26, wherein the material bridge is one of a plurality of material bridges arranged inside one or more of the pass-through openings.

28. The contact probe of claim 26, wherein the material bridges are placed at one end of the pass-through openings.

29. The contact probe of claim 25, wherein the material bridge is placed at one end of the pass-through opening.

30. The contact probe of claim 25, further comprising a protruding element or stopper originating from a lateral wall of the probe body.

* * * * *